(12) United States Patent
Toshima et al.

(10) Patent No.: US 7,229,522 B2
(45) Date of Patent: Jun. 12, 2007

(54) SUBSTRATE PROCESSING APPARATUS AND SUBSTRATE PROCESSING METHOD

(75) Inventors: Takayuki Toshima, Nirasaki (JP); Hitoshi Abe, Tokyo-To (JP)

(73) Assignees: Tokyo Electron Limited, Tokyo-Te (JP); Sony Corporation, Tokyo-To (JP)

( * ) Notice: Subject to any disclaimer, the term of this patent is extended or adjusted under 35 U.S.C. 154(b) by 0 days.

(21) Appl. No.: 10/431,364

(22) Filed: May 8, 2003

(65) Prior Publication Data
US 2004/0063319 A1    Apr. 1, 2004

(30) Foreign Application Priority Data
May 8, 2002    (JP) .............. 2002-132698

(51) Int. Cl.
C23F 1/00      (2006.01)
H01L 21/306    (2006.01)
B08B 3/00      (2006.01)

(52) U.S. Cl. .................. 156/345.27; 156/29; 156/914; 134/94.1

(58) Field of Classification Search ................ 118/715, 118/733; 156/345.29
See application file for complete search history.

(56) References Cited

U.S. PATENT DOCUMENTS

| | | | | |
|---|---|---|---|---|
| 4,341,592 A | * | 7/1982 | Shortes et al. ................. | 134/2 |
| 5,044,311 A | * | 9/1991 | Mase et al. ............... | 118/723 E |
| 5,044,314 A | * | 9/1991 | McNeilly ................... | 118/715 |
| 5,073,232 A | * | 12/1991 | Ohmi et al. .................. | 216/73 |
| 5,891,350 A | * | 4/1999 | Shan et al. .................... | 216/71 |
| 5,944,917 A | * | 8/1999 | Takeda et al. ............... | 148/240 |
| 6,090,211 A | | 7/2000 | Kamei et al. | |
| 6,299,696 B2 | | 10/2001 | Kamikawa et al. | |
| 6,673,196 B1 | * | 1/2004 | Oyabu ................... | 156/345.31 |
| 6,786,976 B1 | * | 9/2004 | Gottschalk et al. ........... | 134/10 |
| 6,817,369 B1 | * | 11/2004 | Riedel et al. ............... | 134/98.1 |
| 2002/0045008 A1 | * | 4/2002 | Toshima et al. ......... | 427/248.1 |
| 2002/0134409 A1 | * | 9/2002 | Scovell ........................ | 134/61 |

FOREIGN PATENT DOCUMENTS

| | | |
|---|---|---|
| JP | 62-024630 | 2/1987 |
| JP | 07037866 A * | 2/1995 |
| JP | 07-122537 | 5/1995 |
| JP | 9-266173 | 10/1997 |
| WO | WO 9962649 A1 * | 12/1999 |
| WO | WO 200129883 A1 * | 4/2001 |

OTHER PUBLICATIONS

Taiwan Office Action issued on Mar. 3, 2005, and English translation.

* cited by examiner

*Primary Examiner*—Karla Moore
(74) *Attorney, Agent, or Firm*—Smith, Gambrell & Russell LLP

(57) ABSTRACT

A substrate processing apparatus removes resist films formed on wafers by holding the wafers in a processing vessel and exposing the wafers to a mixed gaseous fluid of steam and an ozone-containing gas into the processing vessel. The inner surfaces, to be exposed to the mixed gaseous fluid, of the processing vessel and the surfaces, to be exposed to the mixed gaseous fluid, of component members placed in the processing vessel are coated with $SiO_2$ film to protect the same from the corrosive action of the mixed gaseous fluid.

18 Claims, 6 Drawing Sheets

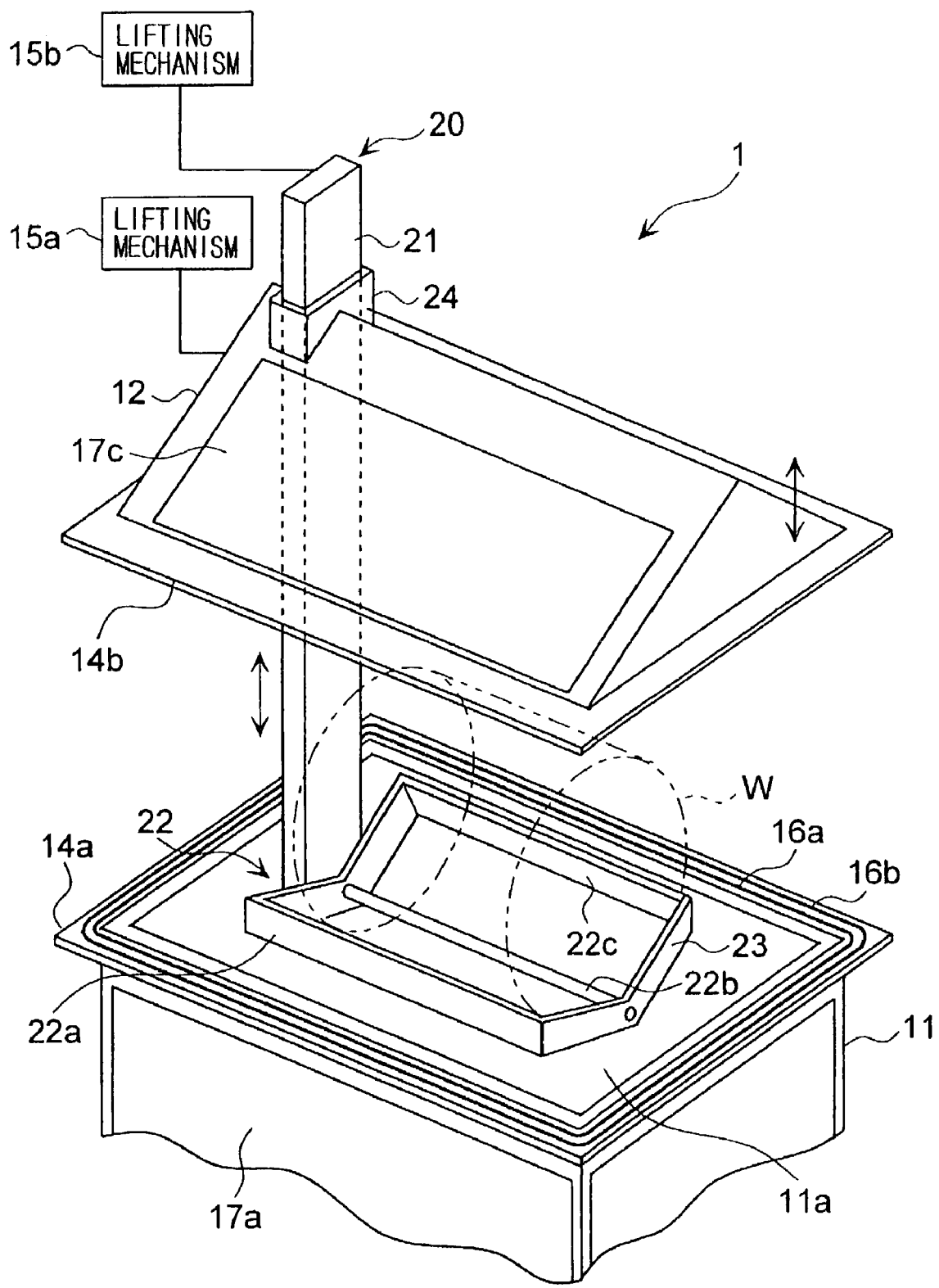
F I G. 1

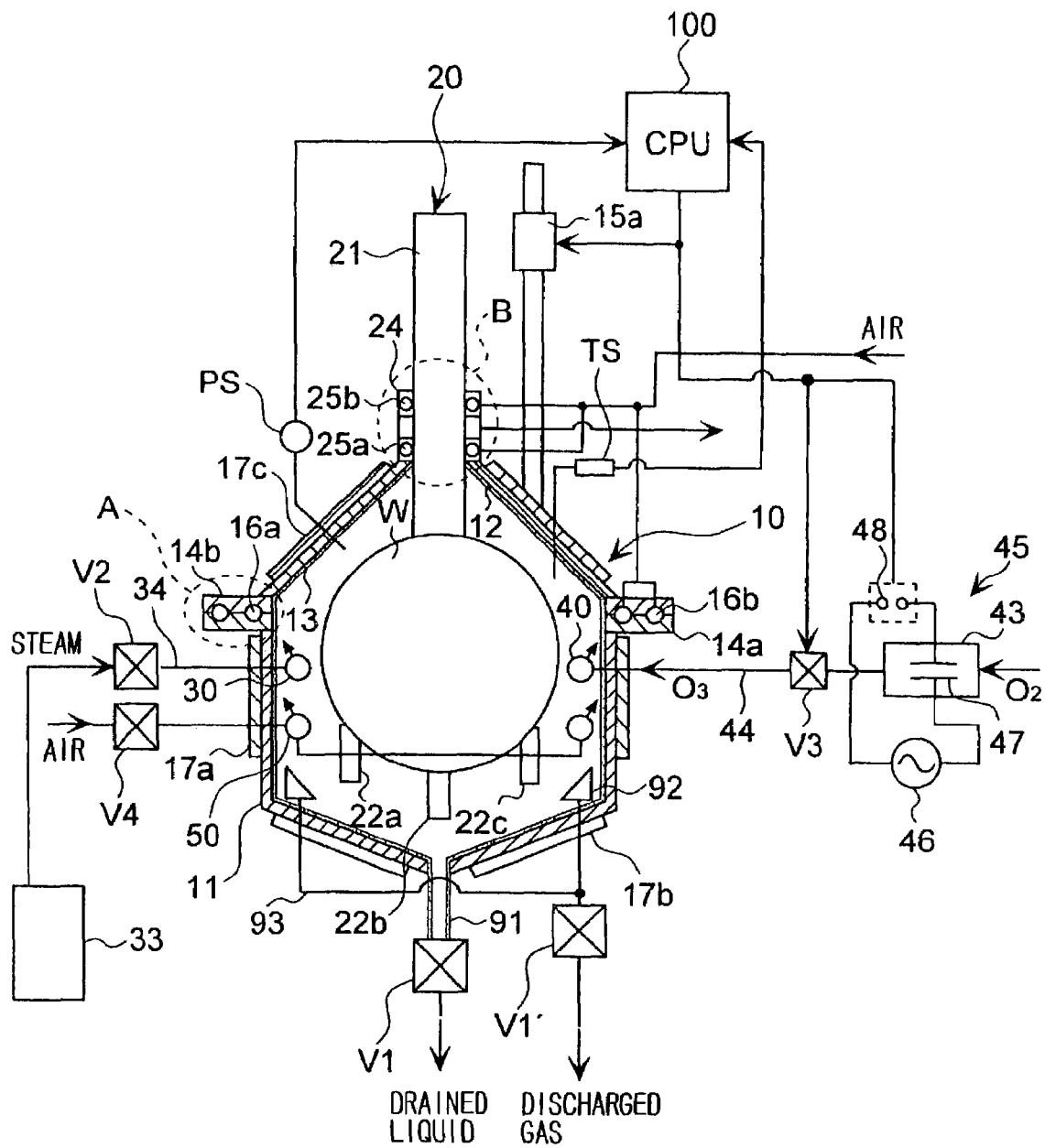
F I G. 2

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method for processing substrates, such as semiconductor wafers or glass substrates for LCDs (liquid crystal displays), in an atmosphere containing a vapor and a gas.

2. Description of the Related Art

Generally, a semiconductor device fabricating method includes a step of forming a predetermined circuit pattern on-a semiconductor wafer by photolithography. More specifically, a semiconductor device fabricating method includes series of steps of applying a liquid photoresist to a semiconductor wafer cleaned by a cleaning process to form a photoresist film, exposing the photoresist film to a desired light pattern, subjecting the exposed photoresist film to a developing process to form a photoresist mask, subjecting the semiconductor wafer to an etching process and a doping process, and removing the photoresist mask, i.e., the photoresist film, from the semiconductor wafer.

A known resist film removing method of removing a resist film from a semiconductor wafer immerses the semiconductor wafer in a cleaning tank holding a chemical liquid called SPM solution containing sulfuric acid and hydrogen peroxide, or a chemical liquid containing ozone. The known resist film removing method has problems that particles contained in the chemical liquid adhere to the semiconductor wafer when the semiconductor wafer is immersed in the chemical liquid, and particles removed from the semiconductor wafer and suspended in the chemical liquid adhere to other semiconductor wafers. The disposal of waste liquid produced by the resist film removing method using the SPM solution is costly.

A recently proposed resist film removing method includes a step of altering a resist film formed on a semiconductor wafer with a gas containing steam and an ozone-containing gas, and then subjecting the semiconductor wafer having the altered resist film to a water cleaning process to remove the resist film. The altering step is carried out by supplying steam and the ozone-containing gas into the hermetically-closed processing vessel accommodating a semiconductor wafer.

However, a mixed gaseous fluid produced by thus mixing steam and the ozone-containing gas is highly corrosive, corrodes various component members of the processing apparatus, such as a wafer holder, placed in the processing vessel, and corroded parts produce particles that contaminate the semiconductor wafer.

SUMMARY OF THE INVENTION

The present invention has been made in view of those problems and it is therefore an object of the present invention to provide a substrate processing apparatus and a substrate processing method capable of preventing the corrosion of a processing vessel and component members placed in the processing vessel.

According to the first aspect of the present invention, a substrate processing apparatus is provided, which includes: a processing vessel adapted to accommodate a substrate therein to process the substrate with a mixed gaseous fluid containing a vapor and a gas supplied into the processing vessel; and a component member of said processing apparatus placed in the processing vessel; wherein at least one of an inner surface, to be exposed to the mixed gaseous fluid, of the processing vessel and a surface, to be exposed to the mixed gaseous fluid, of the component member is coated with a $SiO_2$ film.

According to the second aspect of the present invention, a substrate processing method is provided, which includes the steps of: (i) placing a substrate, coated with resist films, in a processing vessel having an inner surface coated with $SiO_2$ film, the vessel containing a component member coated with $SiO_2$ film; (ii) supplying steam and an ozone-containing gas into the processing vessel thereby processing the substrate with the steam and the ozone-containing gas; (iii) stopping supplying the steam and the ozone-containing gas into the processing vessel; and (iv) discharging gases remaining in the processing vessel therefrom, and supplying air into the processing vessel.

The substrate processing apparatus and the substrate processing method of the present invention protect the inner surfaces of the walls of the processing vessel and the component members placed in the processing vessel from corrosive actions of the processing gas. Thus, the substrate processing apparatus has high durability. Since the production of particles and such in the processing vessel can be prevented, the substrates can be processed to obtain high-quality substrates. When the processing vessel is constructed in a pressure vessel, processing time necessary for processing substrates can be reduced by raising the pressure of the processing gas in the processing vessel to improve throughput.

BRIEF DESCRIPTION OF THE DRAWINGS

The above and other objects, features and advantages of the present invention will become more apparent from the following description taken in connection with the accompanying drawings, in which:

FIG. 1 is a perspective view of a resist film removing apparatus, i.e., a substrate processing apparatus, in a preferred embodiment according to the present invention;

FIG. 2 is a schematic sectional view of the resist film removing apparatus shown in FIG. 1;

DESCRIPTION OF THE PREFERRED EMBODIMENTS

Figure 3:
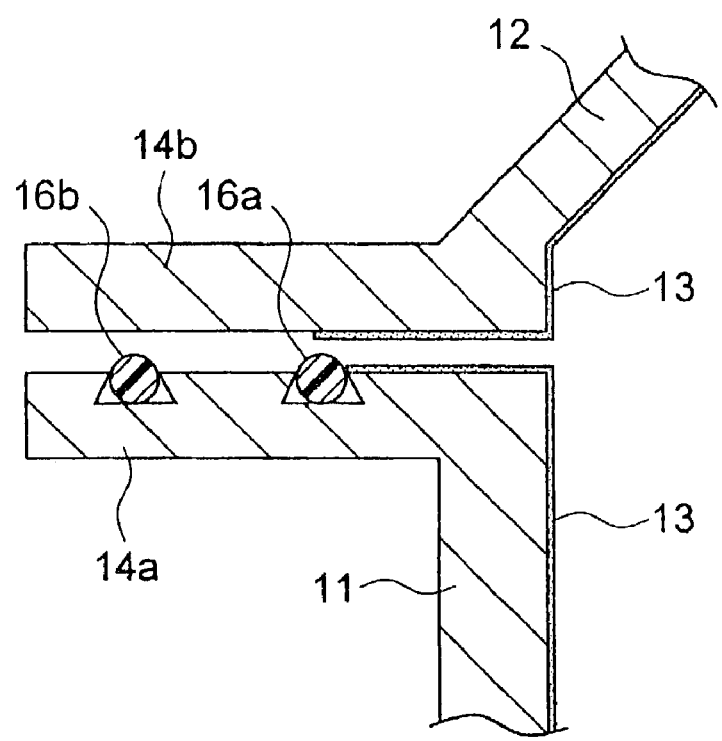
FIG. 3 is an enlarged view of a region A in FIG. 2.

A resist film removing apparatus 1 in a preferred embodiment according to the present invention will be described as applied to removing useless resist films formed on semiconductor wafers (hereinafter, referred to simply as "wafers") W by supplying a gas and a vapor to alter the resist film by a mixed gaseous fluid of the gas and the vapor. In this embodiment, the vapor is steam (water vapor, typically pure-water vapor), and the gas is an ozone-containing gas (which is oxygen gas containing ozone gas of a predetermined concentration).

Referring to FIGS. 1 and 2, the resist film removing apparatus 1 includes: a processing vessel 10 in which wafers W are processed; a wafer guide 20, i.e., a wafer holding device that holds wafers W in the processing vessel 10; a steam jetting nozzle 30 that supplies steam into the processing vessel 10; an ozone-containing gas jetting nozzle 40 that supplies an ozone-containing gas containing ozone ($O_3$) into the processing vessel 10; and air jetting nozzles 50 that supplies air into the processing vessel 10.

The processing vessel 10 includes a vessel body 11 capable of accommodating, for example, fifty wafers W, and a vessel cover 12 for covering an open upper end, serving as a wafer entrance 11a, of the vessel body 11. Wafers W are carried into and carried out of the vessel body 11 through the wafer entrance 11a. The vessel cover 12 can be moved vertically by a lifting mechanism 15a. A central processing unit (CPU) 100 connected to the lifting mechanism 15a gives control signals to the lifting mechanism 15a to move the vessel cover 12 vertically.

A flange 14a is formed around the upper end of the vessel body 11. A flange 14b is formed around the lower end of the vessel cover 12. O-rings 16a and 16b are fitted in grooves formed in the upper surface of the flange 14a. The O-rings are compressed between the flanges 14a and 14b when the vessel cover 12 is lowered and the flanges 14a and 14b are joined together to seal the vessel body 11.

A tubular guide 24 is attached to an upper part of the vessel cover 12 to project therefrom. A shaft 21 of the wafer guide 20 extends through the tubular guide 24. Inflatable seals 25a and 25b capable of being inflated with compressed air are placed on the inner surface of the tubular guide 24. The inflatable seals 25a and 25b are inflated with compressed air to seal gaps between the inner surface of the tubular guide 24 and the outer surface of the shaft 21. The vessel cover 12 is lowered so that the flanges 14a and 14b are joined closely together, and a predetermined quantity of compressed air is supplied into the inflatable seals 25a and 25b to create a sealed space in the processing vessel 10.

The vessel cover 12 has inclined walls each sloping down from the central part of the vessel cover 12 towards the end of the vessel cover 12. The vessel cover 12 has a cross section substantially resembling the inverted letter V. Water drops formed on the inner surfaces of the inclined walls the vessel cover 12 by the condensation of steam flow down along the inclined inner surfaces of the inclined walls and the inner surfaces of the side walls of the vessel body 11 to the bottom of the vessel body 11. Thus, the water drops formed on the inner surfaces of the vessel cover 12 do not drop onto the wafers W held in the vessel body 11.

Rubber heaters 17a and 17b are attached to the outer surfaces of the side walls and the bottom walls of the vessel body 11, respectively, and rubber heaters 17c are attached to the outer surface of the vessel cover 12. A power source, not shown, supplies electric power to the rubber heaters 17a, 17b and 17c to heat the interior of the processing vessel 10 by heat generated by the rubber heaters 17a, 17b and 17c. The CPU 100 controls power supply to the rubber heaters 17a, 17b and 17c to maintain the interior of the processing vessel substantially at a predetermined temperature in the range of, for example, 80° C. to 120° C.

Dew condensation on the inner surface of the processing vessel 10 can be prevented by heating with the rubber heaters 17a, 17b and 17c. The prevention of dew condensation on the inner surface of the vessel cover 12 by heating with the rubber heaters 12c is effective in preventing dropping of dew drops on the wafers W contained in the processing vessel 10. Processing time necessary for processing the wafers W can be reduced by maintaining the interior of the processing vessel 10 at such a high temperature in the range of 80° C. to 120° C.

The processing time can further be reduced by maintaining the interior of the processing vessel 10 at a positive pressure higher than the atmospheric pressure by a pressure difference in the range of, for example, 0.05 to 0.1 MPa in addition to maintaining the interior of the processing vessel 10 at a temperature in the range of 80° C. to 120° C. Suitable materials for forming the processing vessel 10 that needs to withstand such a positive pressure are metals, such as stainless steels, brasses, aluminum and steels.

Those metals, however, are susceptible to the corrosive action of the mixed gaseous fluid of the ozone-containing gas and steam, and have a tendency to be corroded at a high rate under a high-temperature, high-pressure condition. Therefore, the service life of the processing vessel 10 is short if the inner surfaces of the vessel walls formed of aforementioned metals are exposed to the mixed gaseous fluid. In addition, the corroded metal members produce particles and the wafers W contained in the processing vessel 10 are contaminated with those particles.

To protect the processing vessel 10 from corrosion and to provide the processing vessel 10 with strength sufficient to withstand process pressure, the processing vessel 10 is made of aforementioned metals, and the inner surface, to be exposed to the mixed gaseous fluid of steam and the ozone-containing gas, of the processing vessel 10 is coated with a $SiO_2$ film 13. Thus, the processing vessel 10 has excellent durability and long service life. Since the inner surface of the processing vessel 10 is protected from corrosion, particles are not produced and hence the processed wafers W have a high quality.

The $SiO_2$ film 13 can be formed on the inner surface of the processing vessel 10 by, for example, a $SiO_2$ film forming process that applies an organic Si compound or a solution prepared by mixing an organic Si compound and a solvent (hereinafter, referred to "Si-containing raw material") to the inner surface of the processing vessel 10 to form a thin layer of the Si-containing raw material and bakes the thin layer of the Si-containing raw material to form a thin $SiO_2$ film. This $SiO_2$ film forming process is repeated several times to form a $SiO_2$ film consisting of a plurality of thin $SiO_2$ layers and having a desired thickness in the range of, for example, 0.5 to 1.5 μm. The formation of the $SiO_2$ film of a desired thickness by repeating the $SiO_2$ film forming process prevents the development of cracks in the thin $SiO_2$ layers during baking. The $SiO_2$ film of such a thickness imparts sufficient durability in the corrosive atmosphere of the mixed gaseous fluid of steam and the ozone-containing gas to the processing vessel 10. When the temperature of the atmosphere in the processing vessel 10 is in the range of 80° C. to 120° C., cracks are not produced due to the difference in thermal expansion between the metal forming the processing vessel 10 and the $SiO_2$ film of such a thickness. The $SiO_2$ film forming process does not need to be repeated excessively many times to form the $SiO_2$ film of the desired thickness.

Figure 4:
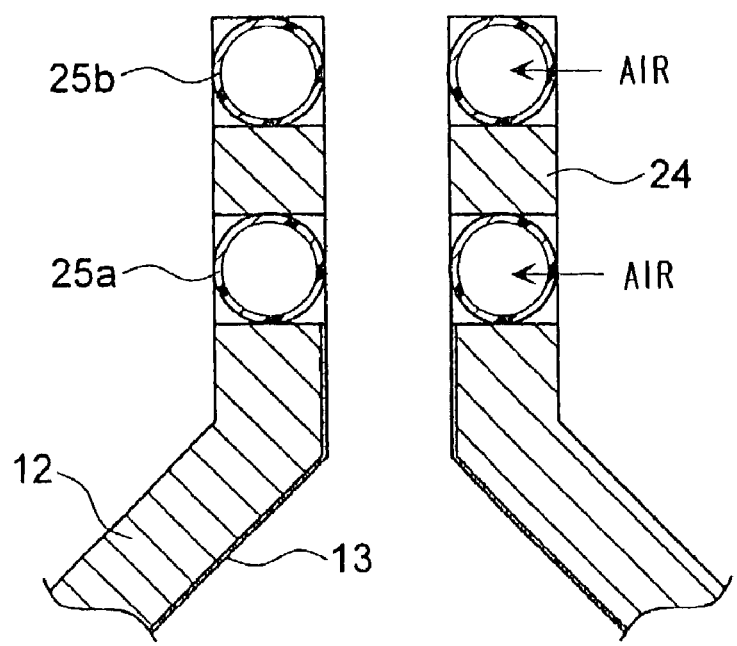
FIG. 4 is an enlarged view of a region B in FIG. 2.

The $SiO_2$ film 13 coating the inner surface of the processing vessel 10 are formed on the joining surfaces of the flanges 14a and 14b and on the inner surface of the tubular guide 24 as shown in FIGS. 3 and 4. Referring to FIG. 3 showing region "A" in FIG. 2 in enlarged views, the SiO$_2$ films 13 coats an area, in the joining surface of the flange 14a, from the inner edge of the flange 14a to a position where the inner O-ring 16a is arranged. The SiO$_2$ films 13 also coats an area, in the joining surface of the flange 14b, from the inner edge of the flange 14b to a position where the inner O-ring 16a is abutted. Thus, the flanges 14a and 14b are protected from corrosion.

Referring to FIG. 4 showing region "B" in FIG. 2 in enlarged views, an area extending downward from the lower inflatable seal 25a, in the inner surface of the tubular guide 24, is coated with the SiO$_2$ film 13. Thus, the tubular guide 24 is protected from corrosion.

Referring again to FIG. 2, a drain pipe 91 is connected to the bottom wall of the vessel body 11 to drain water produced by the condensation of steam supplied into the processing vessel 10 and collected in the bottom of the processing vessel 10. A SiO$_2$ film 13 also coats the inner surface of the drain pipe 91 to protect the drain pipe 91 from corrosion. Discharge members 92 for discharging the mixed gaseous fluid of steam and the ozone-containing gas are disposed in a lower part of the vessel body 11. A discharge pipe 93 is connected to the discharge members 92. Parts, lying inside the processing vessel 10 and exposed to the mixed gaseous fluid of steam and the ozone-containing gas, of the discharge members 92 and the discharge pipe 93 are coated with SiO$_2$ films, not shown, to protect them from corrosion.

Drain pipe 91 and the discharge pipe 93 are provided with valves V1 and V1', respectively. A pressure sensor PS is placed in the processing vessel 10 to measure the pressure in the processing vessel 10. The pressure sensor PS sends a signal representing a measured pressure to the CPU 100. Then, the CPU 100, while feeding the ozone-containing gas and steam into the processing vessel 10, adjusts the respective openings of the valves V1 and V1' to drain water and to discharge the ozone-containing gas and the steam at a proper discharge rate so that the predetermined pressure is maintained in the processing vessel 10.

An ozone decomposer, not shown, is connected to a lower part of the discharge pipe 93. The ozone decomposer decomposes ozone contained in the gas discharged through the discharge pipe 93 into oxygen and discharges oxygen, for example, into the atmosphere. Since it is possible that the ozone-containing gas is discharged through the drain pipe 91, the gas discharged through the drain pipe 91 is sent to the ozone decomposer to decompose ozone contained in the gas. The discharge pipe 93 is connected to a forced discharge device, not shown, for forcibly discharging gases from the processing vessel 10.

As shown in FIG. 1, the wafer guide 20 includes, as principal components, the shaft 21 and a wafer holder 22 connected to the lower end of the shaft 21. The wafer guide 20 is moved vertically by a lifting mechanism 15b. The lifting mechanism 15b moves the wafer holder 22 vertically between a processing position in the vessel body 11 and a transfer position above the vessel body 11. The wafers W are transferred between the wafer holder 22 and an external wafer conveyer at the transfer position. The inflatable seals 25a and 25b of the vessel cover 12 are deflated before the wafer guide 20 is moved vertically.

The wafer holder 22 includes wafer support members 22a, 22b and 22c held in a horizontal position, and connecting members 23 connecting and holding the wafer support members 22a, 22b and 22c in a parallel arrangement. Grooves, not shown, are formed at predetermined intervals in the wafer support members 22a, 22b and 22c. Wafers W are supported on the wafer support members 22a, 22b and 22c with their peripheral parts received in the grooves of the wafer support members 22a, 22b and 22c. The vessel cover 12 is raised and the wafer entrance 11a of the vessel body 11 is opened to transfer wafers W from the external wafer conveyer to the wafer support members 22a, 22b and 22c, and vice versa.

The component members of the wafer guide 20 are formed of a material having a high mechanical strength, such as a stainless steel, to hold wafers W without deformation of the component members of the wafer guide 20 and to be able to move smoothly vertically with the wafers W. Parts, to be exposed to the mixed gaseous fluid of steam and the ozone-containing gas in a state where the wafer holder 22 is held at the processing position in the vessel body 11 and the vessel cover 12 is closed to seal the processing vessel 10, of the wafer guide 20 are coated with SiO$_2$ films, not shown, to protect the wafer guide 20 from corrosion and to prevent contaminating the wafers W with particles.

The SiO$_2$ films may be formed on those parts to be exposed to the mixed gaseous fluid after assembling the wafer guide 20. The SiO$_2$ films may be formed on those separate parts before assembling those parts.

Steam generated by a steam generator 33 is supplied through a steam supply pipe 34 to the steam jetting nozzle 30. A heating device, not shown, heats the steam supply pipe 34 at a predetermined temperature to prevent the condensation of steam in the steam supply pipe 34. The opening of a valve V2 placed in the steam supply pipe 34 is controlled to supply steam at a predetermined rate to the steam jetting nozzle 30. The opening of the valve V2 is controlled by the CPU 100.

Figure 5:
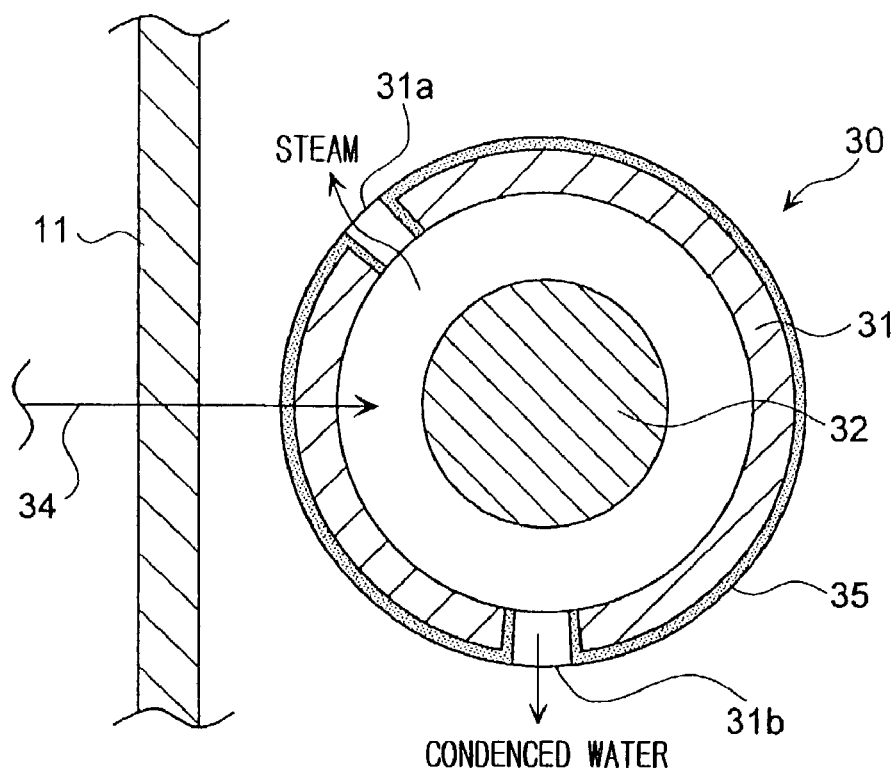
FIG. 5 is a schematic sectional view of a steam jetting device.

Referring to FIG. 5 showing the steam jetting nozzle 30 in a schematic sectional view, the steam jetting nozzle 30 includes, as principal components, a pipe 31 extending perpendicularly to the paper of FIG. 5, and a bar-shaped heater 32 extending inside the pipe 31. The pipe 31 is provided with steam jetting holes 31a through which steam is jetted, and drain ports 31b. Water produced by the condensation of steam in the pipe 31 is drained through the drain ports 31b. The steam jetting holes 31a and the drain ports 31b are arranged in a longitudinal direction of the steam jetting nozzle 30 at regular intervals, respectively.

Steam carried by the steam supply pipe 34 into the pipe 31 flows through an annular space defined by the pipe 31 and the heater 32 therebetween, and is jetted through the steam jetting holes 31a into the processing vessel 10. The steam jetting holes 31a are formed in the pipe 31 such that steam is jetted through the steam jetting holes 31a, obliquely upward in a direction inclined at an angle of about 45° to a horizontal plane, toward the inner surface of the vertical side wall of the vessel body 11. Thus, steam jetted through the steam jetting holes 31a flows upward along the inner surface of the side wall of the processing vessel 10, and is mixed with the ozone-containing gas is jetted by the ozone-containing gas jetting nozzle 40 at an upper part of the interior space of the processing vessel 10, i.e., in an upper space covered with the vessel cover 12. Then, the mixed gaseous fluid of the steam and the ozone-containing gas flows downward through spaces between the wafers W.

Irregular processing of the wafers W due to the direct contact of steam with the wafers W before the steam and the ozone-containing gas is mixed can be prevented by jetting the steam in the aforementioned manner. Even if water drops are jetted together with steam through the steam jetting holes 31a, the water drops do not wet the wafers W and do not cause the irregular processing of the wafers W.

The heater 32 prevents the condensation of steam in the pipe 31. Even if water is produced by condensation in the pipe 31, the water can be drained downward through the drain holes 31b. Water drained through the drain holes 31b and steam discharged together with water through the drain holes 31b do not come into direct contact with the wafers W, and hence the wafers W are prevented from being contaminated. The number of the drain holes 31b may be smaller than that of the steam jetting holes 31a.

With the steam jetting nozzle 30, the outer surface of the pipe 31 and the inner surfaces of the steam jetting holes 31a and the drain holes 31b are coated with $SiO_2$ films 35 in order to protect the pipe 31 from corrosion and to prevent the contamination of the wafers W with particles discharged together with steam into the processing vessel 10. In addition, a part of the steam supply pipe 34 extending in the processing vessel 10 and exposed to the mixed gaseous fluid of the steam and the ozone-containing gas is coated with a $SiO_2$ film to prevent the production of particles in the processing vessel 10.

Figure 6:
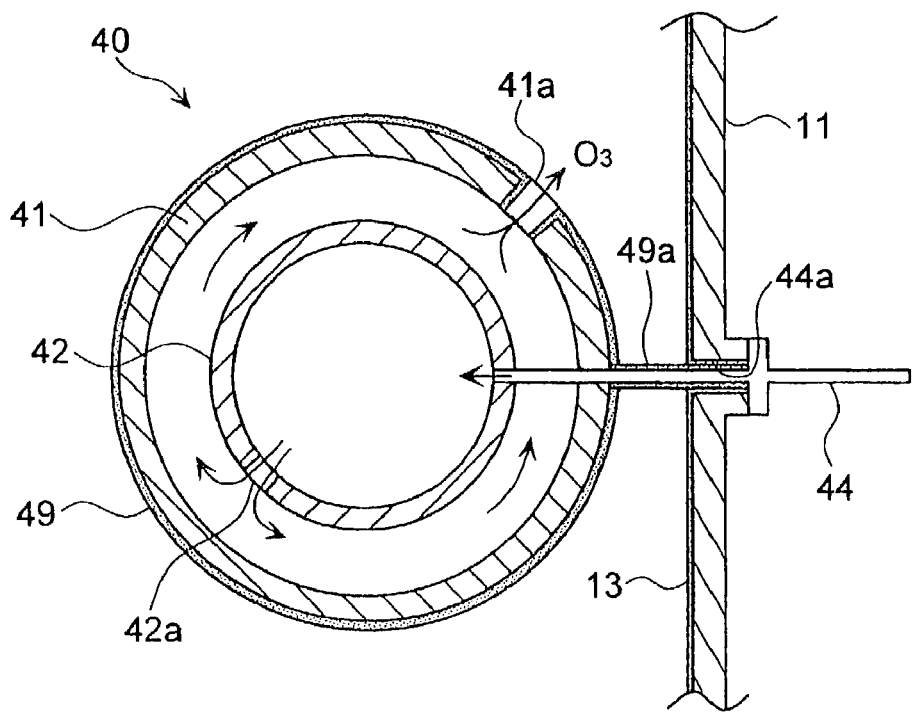
FIG. 6 is a schematic sectional view of an ozone-containing gas jetting device.

The ozone-containing gas jetting nozzle 40 is disposed on the opposite side of the steam jetting nozzle 30 with respect to the wafers W held in the processing vessel 10. FIG. 6 shows the structure of the ozone-containing gas jetting nozzle 40 and a manner in which the nozzle 40 is attached to the vessel body 11. The ozone-containing gas jetting nozzle 40 has a tubular shape, and has a double-tube structure including an outer pipe 41 and an inner pipe arranged in the outer pipe 41. The outer pipe 41 is provided with ozone-containing gas jetting holes 41a arranged in a longitudinal direction of the nozzle 40 at predetermined intervals. The inner pipe 42 is provided with ozone-containing gas jetting holes 42a arranged in the longitudinal direction of the nozzle 40 at regular intervals. The ozone-containing gas jetting holes 41a and 42a jet the ozone-containing gas in diametrically opposite directions.

An ozone supply system 45 supplies the ozone-containing gas into the ozone-containing gas jetting nozzle 40. The ozone supply system 45 includes an ozone generator 43, an ozone gas supply pipe 44, and a valve V3 placed in the ozone gas supply pipe 44. The ozone generator 43 is provided with opposite discharge electrodes 47. A high-frequency power source 46 applies a high-frequency voltage across the discharge electrodes 47 while oxygen ($O_2$) is supplied in the space between the discharge electrodes 47 to convert part of the oxygen into ozone. The CPU 100 provides control signals for controlling a switch 48 placed in a power circuit included in the ozone generator 43 to control the ozone concentration of the ozone-containing gas produced by the ozone generator 43. When the ozone generator 43 is not in operation, oxygen, i.e., source gas, can be jetted into the processing vessel 10.

The ozone-containing gas produced by the ozone generator 43 is supplied through the ozone-containing gas supply pipe 44 into the inner pipe 42. The CPU 100 gives control signals to the valve V3 to make the valve V3 regulate the flow of the ozone-containing gas in the ozone-containing gas supply pipe 44. Then, the ozone-containing gas supplied into the inner pipe 42 is jetted through the ozone-containing gas jetting holes 42a into an annular space between the outer pipe 41 and the inner pipe 42, and is jetted through the ozone-containing gas jetting holes 41a of the outer pipe 41, obliquely upward in a direction inclined at an angle of about 45° to a horizontal plane, toward the inner surface of the vertical sidewall of the vessel body 11. The ozone-containing gas jetted through the ozone-containing gas jetting holes 41a flows upward along the inner surface of the side wall of the processing vessel 10. The ozone-containing gas and the steam jetted by the steam jetting nozzle 30 are mixed in the upper part of the interior space of the processing vessel 10, i.e., in the upper space covered with the vessel cover 12, and then flow downward through spaces between the wafers W.

Since the ozone-containing gas jetted through the ozone-containing gas jetting holes 42a flows through the annular space between the outer pipe 41 and the inner pipe 42 toward the ozone-containing gas jetting holes 41a, the ozone-containing gas can uniformly be jetted through the ozone-containing gas jetting holes 41a into the processing vessel 10.

With the ozone-containing gas jetting nozzle 40, the outer surface of the outer pipe 41 and the inner surfaces of the ozone-containing gas jetting holes 41a are coated with $SiO_2$ films 49, respectively, to protect the outer pipe 41 from corrosion and to prevent the contamination of the wafers W with particles discharged together with the ozone-containing gas into the processing vessel 10.

As shown in FIG. 6, an end part of the ozone-containing gas supply pipe 44 is passed through a hole 44a formed in the vessel body 11 and is held fixedly in place. The inner surface of the hole 44a is coated with a $SiO_2$ film 13. In addition, a part, extending in the processing vessel 10 to be exposed to the mixed gaseous fluid of steam and the ozone-containing gas, of the ozone-containing gas supply pipe 44 is coated with a $SiO_2$ film 49a. Thereby, a part, holding the ozone-containing gas supply pipe 44, of the vessel body 11, and the ozone-containing gas supply pipe 44 are protected from corrosion. Thus, the production of particles in the processing vessel 10 can be prevented. Preferably, the steam jetting nozzle 30 and the air jetting nozzles 50 are attached to the vessel body 11 in the same manner as the manner in which the ozone-containing gas supply nozzle 40 is attached to the vessel body 11.

The air jetting nozzles 50 are disposed below the steam jetting nozzle 30 and the ozone-containing gas jetting nozzle 40, respectively. The construction of the air jetting nozzles 50 maybe, for example, similar to that of the ozone-containing gas jetting nozzle 40. Air supplied from an air source, not shown, to the air jetting nozzles 50 is jetted, obliquely upward in direction inclined at an angle of about 45° to a horizontal plane, toward the inner surfaces of the opposite vertical side walls of the vessel body 11 to prevent the direct contact of air with the wafers W and the resultant contamination of the wafers W with particles. Thus, the formation of traces on the surfaces of the wafers W due to direct contact with jetted air can be prevented. The temperature of air jetted by the air jetting nozzles 50 into the processing vessel 10 is in the range of an ordinary temperature to 280° C.

The flow of air into the air jetting nozzles 50 is regulated by regulating the opening of the valve V4 by the CPU 100.

Figure 7:
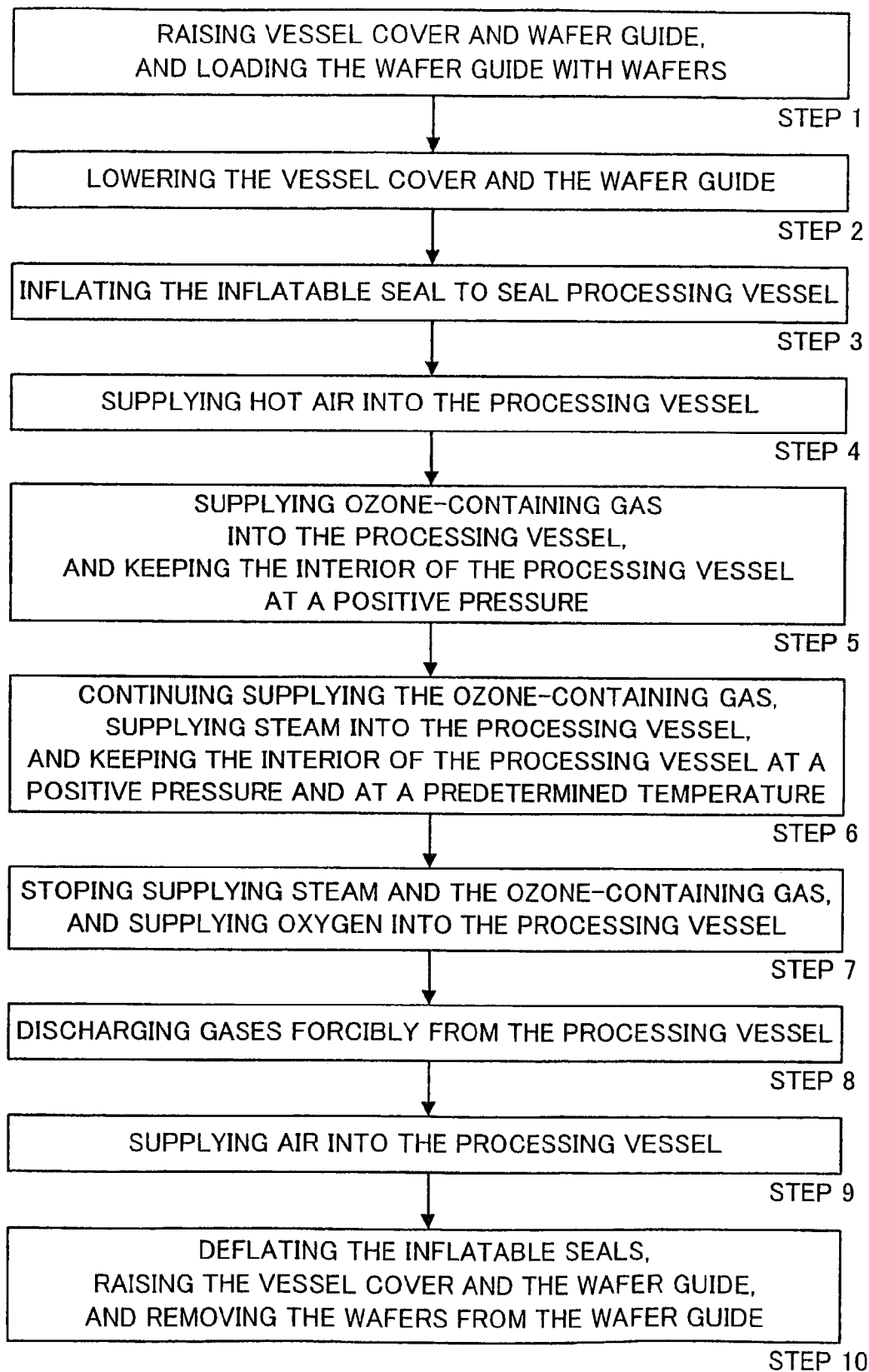
FIG. 7 is a flowchart of a resist film removing procedure to be carried out by the resist film removing apparatus shown in FIG. 1.

A wafer processing procedure to be performed by the resist film removing apparatus 1 will be described with reference to a flow chart shown in FIG. 7. The vessel cover 12 is raised to open the wafer entrance 11a, the wafer holder 22 is moved to a position above the vessel body 11, and wafers W carried by a wafer conveyer, not shown, is transferred from the wafer conveyer to the wafer holder 22 so as to support the wafers W on the wafer support members 22a, 22b and 22c (Step 1).

The lifting mechanism 15b moves the wafer guide 20 down to hold the wafer holder 22 holding the wafers W at a predetermined position in the vessel body 11 and the lifting mechanism 15a lowers the vessel cover 12 to bring the flange 14b of the vessel cover 12 into close contact with the flange 14a of the vessel body 11 (Step 2). Then, the inflatable seals 25a and 25b are inflated to seal the gaps between the tubular guide 24 and the shaft 21 so that the processing vessel 10 is sealed (Step 3).

Thereafter, hot air heated at, for example, 280° C. is supplied through the air jetting nozzles 50 into the processing vessel 10 to heat the wafers W and the atmosphere in the processing vessel 10 at a predetermined process temperature of, for example, 80° C. (Step 4). Subsequently, an ozone-containing gas containing 9% by volume ozone is supplied through the ozone-containing gas jetting nozzle 40 into the processing vessel 10 at a supply rate of about 10 l/min so that the interior of the processing vessel 10 is maintained at a predetermined pressure higher than the atmospheric pressure by a pressure difference in the range of, for example, 0.01 to 0.3 MPa (Step 5).

After the rise of the pressure in the processing vessel 10 to the predetermined pressure has been confirmed from a signal provided by the pressure sensor PS, steam is supplied in step 6 through the steam jetting nozzle 30 into the processing vessel 10 at a water-equivalent supply rate of, for example, 100 dm³/min while the supply of the ozone-containing gas is continued (Step 6). The steam and the ozone-containing gas are mixed in the processing vessel 10 to be a mixed gaseous fluid, which alters the resist film formed on the wafers W so that the resist film is readily removable by a water cleaning process.

Since the parts to be exposed to the mixed gaseous fluid in the processing vessel 10 are coated with the $SiO_2$ films, those parts are protected from corrosion. The openings of the valves V1 and V1' are regulated for draining and discharging so that the interior of the processing vessel 10 is maintained during the resist film removing process at a positive pressure higher than the atmospheric pressure by a pressure difference of, for example, 0.056 MPa. The heating operations of the rubber heaters 17a, 17b and 17c are controlled to maintain the wafers W and the interior of the processing vessel 10 at, for example, 80° C.

After the resist altering process has been continued for a predetermined processing time in the range of, for example 3 to 6 min, the supply of steam and the ozone-containing gas is stopped, the operation of the ozone generator 43 is stopped, and the ozone generator 43 supplies oxygen into the processing vessel 10 (Step 7). The operations in step 7 prevent the sharp reduction of the pressure and the temperature in the processing vessel 10 and the resultant dewing of the wafers W.

After supplying oxygen into the processing vessel for a predetermined time of, for example, 1 min, the supply of oxygen is stopped, the oxygen, the ozone-containing gas and the steam remaining in the processing vessel 10 are discharged forcibly through the discharge members 92 (Step 8). Then, air of a room temperature is supplied through the air jetting nozzles 50 into the processing vessel 10 so that the pressure in the processing vessel 10 is equal to the atmospheric pressure (Step 9). Then, the inflatable seals 25a and 25b are deflated, the vessel cover 12 is raised, the wafer guide 20 is raised, the wafers W are transferred from the wafer holder 22 to the not-shown wafer conveyer, and the wafer conveyer carries the wafers W away from the resist film removing apparatus 1. The wafer conveyer carries the wafers to a wafer cleaning apparatus arranged at a place away from the resist removing apparatus 1. The cleaning apparatus cleans the wafers W by a rinse liquid, such as pure wafer, to wash off the resist films remaining on the wafers W.

Figure 8:
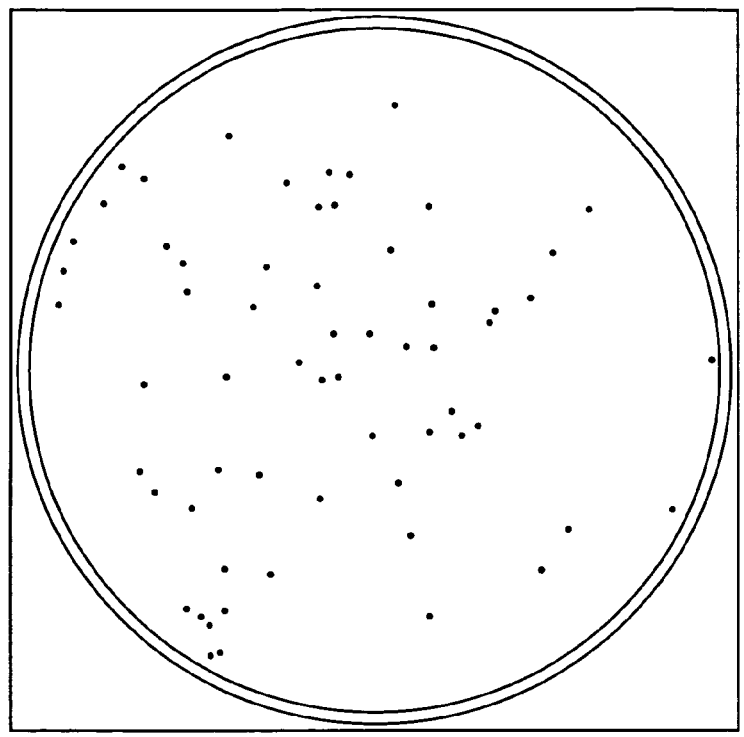
FIG. 8 is a particle map of assistance in explaining the distribution of particles on a semiconductor wafer processed by a substrate processing apparatus provided with a wafer carrier coated with $SiO_2$ films.
Figure 9:
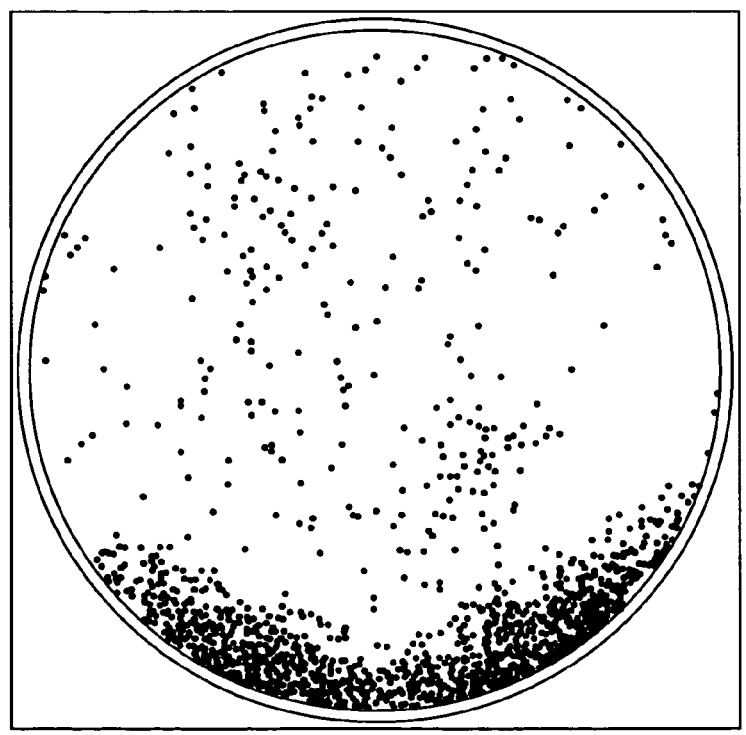
FIG. 9 is a particle map of assistance in explaining the distribution of particles on a semiconductor wafer processed by a substrate processing apparatus provided with a wafer carrier not coated with $SiO_2$ films.

FIG. 8 is a particle map of assistance in explaining the distribution of particles on a semiconductor wafer processed by a resist film removing apparatus provided with a wafer guide "A" formed of a stainless steel and coated with $SiO_2$. FIG. 9 is a particle map of assistance in explaining the distribution of particles on a semiconductor wafer processed by a resist film removing apparatus provided with a wafer guide "B" formed of a stainless steel and not coated with $SiO_2$. A processing vessel 10 having inner surfaces coated with $SiO_2$ films 13 was used for resist film removing tests using the wafer guides "A" and "B". As obvious from FIGS. 8 and 9, the wafer W processed by using the wafer guide "A" was contaminated with a relatively small number of particles, and the wafer W processed by using the wafer guide "B" was contaminated with a relatively large number of particles. As obvious from FIG. 9, the particles were distributed in a high density particularly in areas around parts of the wafer W in contact with the wafer support members. Whereas the appearance of the wafer guide "A" was not changed by the resist film altering (removing) process, the surfaces of the wafer guide "B" were browned by the resist film altering (removing) process, which proved that the $SiO_2$ films have satisfactory corrosion resistance to the mixed gaseous fluid containing steam and the ozone-containing gas. Thus, it is known that coating the parts, to be exposed to the mixed gaseous fluid, of the processing vessel 10 with $SiO_2$ films is effective in guaranteeing the high quality of wafers W.

When a test wafer guide provided with wafer support members 22a, 22b and 22c formed of a fluororesin, such as Teflon®, was used, wafers W were contaminated with many particles, and the wafer support members 22a, 22b and 22c were browned similarly to those of the wafer guide "B", and the durability of the test wafer guide was not higher than that of the wafer guide "A".

Although the invention has been described as applied to the resist film removing apparatus and the resist film removing method, the present invention is not limited thereto in its practical application and applicable to an apparatus and a method for removing resist films from substrates for LCDs. Any suitable vapor, such as a solvent vapor, may be used instead of steam, and any suitable gas maybe used instead of the ozone-containing gas, depending on a substance to be processed, provided that a mixed gaseous fluid produced by mixing the vapor and the gas does not corrode the $SiO_2$ films.

As apparent from the foregoing description, according to the present invention, the corrosion of the inner surfaces of the processing vessel and the members placed in the processing vessel by the processing gas can be inhibited, and the substrate processing apparatus of the present invention has high durability, prevents the production of particles in the processing vessel and is capable of processing substrates in a high quality. The processing vessel is constructed in a pressure vessel, processing time necessary for processing substrates can be reduced by raising the pressure in the processing vessel.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. A substrate processing apparatus comprising:
   a processing vessel adapted to accommodate a substrate therein to process the substrate with a mixed gaseous fluid containing water vapor and ozone-containing gas supplied into the processing vessel;

an ozone generator adapted to generate an ozone-containing gas to be supplied into the processing vessel, by applying electric discharge to oxygen gas;

a component member of said processing apparatus placed in the processing vessel;

a heater adapted to heat an interior of the processing vessel; and a controller configured to control the heater to maintain the interior of the processing vessel at a temperature in a range of 80°C. to 120°C. when the substrate is being processed in the processing vessel by using the water vapor and the ozone-containing gas, wherein an inner surface, to be exposed to the mixed gaseous fluid, of the processing vessel or a surface, to be exposed to the mixed gaseous fluid, of the component member is coated with a $SiO_2$ film, with the $SiO_2$ film having a thickness in a range of 0.5 to 1.5 μm, wherein said apparatus does not include means for generating a plasma in the processing vessel, and the substrate processing apparatus, wherein the $SiO_2$ film comprises at least one baked-on layer produced by applying a Si-containing raw material on the surface to be coated with the $SiO_2$ film, and by baking the Si-containing raw material, and wherein the Si-containing raw material comprises an organic Si compound, or a solution containing a solvent and an organic Si compound dissolved in the solution, and wherein the $SiO_2$ film comprises a plurality of baked-on layers.

2. The substrate processing apparatus according to claim 1, wherein the processing vessel is capable of withstanding a pressure difference of 0.2 MPa or above between interior and exterior thereof.

3. The substrate processing apparatus according to claim 2, wherein the processing vessel is formed of a stainless steel.

4. The substrate processing apparatus according to claim 1, wherein the processing vessel is provided with a hole, the member is arranged in the processing vessel via the hole, and an inner surface of the hole is coated with a $SiO_2$ film.

5. The substrate processing apparatus according to claim 1, wherein the processing vessel includes a vessel body and a vessel cover, a sealing member is placed at a position between joining surfaces of the vessel body and the vessel cover, the inner surface of the processing vessel is coated with a $SiO_2$ film, and the $SiO_2$ film extends continuously from the inner surface of the processing vessel to the position where the sealing member is placed.

6. The substrate processing apparatus according to claim 1, wherein a drain pipe for discharging a liquid from the processing vessel and an exhaust pipe for discharging a gas or a vapor from the processing vessel is connected to the processing vessel, and inner surfaces of the drain pipe and the exhaust pipe are coated with a $SiO_2$ film.

7. The substrate processing apparatus according to claim 1, wherein a steam supply nozzle and an ozone supply nozzle are arranged in the processing vessel to supply water vapor and ozone gas into the processing vessel, respectively, and wherein outer surfaces of the steam supply nozzle and the ozone supply nozzle are coated with $SiO_2$ film.

8. The substrate processing apparatus according to claim 7, wherein inner surfaces of the steam supply nozzle and the ozone supply nozzle are coated with a $SiO_2$ film.

9. The substrate processing apparatus according to claim 1, wherein said apparatus is provided with a substrate holding member as the component member, and substrate holder member is coated with $SiO_2$ film.

10. The substrate processing apparatus according to claim 1, wherein said processing apparatus is a resist film altering processing apparatus.

11. The substrate processing apparatus according to claim 1, wherein both an inner surface, to be exposed to the mixed gaseous fluid, of the processing vessel, and a surface, to be exposed to the mixed gaseous fluid, of the component member are coated with a $SiO_2$ film.

12. A substrate processing apparatus comprising:

a processing vessel adapted to accommodate a substrate therein to process the substrate with a mixed gaseous fluid containing water vapor and ozone-containing gas supplied into the processing vessel;

at least one pipe connected to the processing vessel;

a component member of said processing placed in the processing vessel;

a heater adapted to heat an interior of the processing vessel; and a controller configured to control the heater to maintain the interior of the processing vessel at a temperature in a range of 80°C. to 120°C. when the substrate is being processed in the processing vessel by using the water vapor and the ozone-containing gas, wherein both an inner surface, to be exposed to the mixed gaseous fluid, of the processing vessel or a surface, to be exposed to the mixed gaseous fluid, of the component member is coated with a $SiO_2$ film, an inner surface of the pipe is coated with a $SiO_2$ film, with the $SiO_2$ film having a thickness in a range of 0.5 to 1.5 μm, and wherein the $SiO_2$ film is comprised of a plurality of $SiO_2$ layers.

13. The substrate processing apparatus according to claim 12, wherein said processing apparatus is a resist film altering processing apparatus.

14. The substrate processing apparatus of claim 13, further comprising a dew condensation heater operating in a range of 120°C. to 180°C. for a positive pressure chamber environment.

15. The substrate processing apparatus according to claim 12, wherein the $SiO_2$ film coated on the inner surface of the pipe comprises at least one baked-on layer produced by applying a Si-containing raw material on the surface to be coated with the $SiO_2$ film, and by baking the Si-containing raw material, and wherein the Si-containing raw material comprises an organic Si compound, or a solution containing a solvent and an organic Si compound dissolved in the solution.

16. The substrate processing apparatus according to claim 15, wherein the $SiO_2$ film comprise a plurality of baked-on layers.

17. A substrate processing apparatus, comprising:

a processing vessel adapted to accommodate a substrate therein to process the substrate with a mixed gaseous fluid containing water vapor and an ozone-containing gas supplied into the processing vessel;

an ozone generator adapted to generate an ozone-containing gas to be supplied into the processing vessel by applying electric discharge to oxygen gas;

a component member of said processing apparatus placed in the processing vessel;

a heater adapted to heat an interior of the processing vessel; and a controller configured to control the heater to maintain the interior of the processing vessel at a temperature in a range of 80°C. to 120°C. when the substrate is being processed in the processing vessel by using the water vapor and the ozone gas, wherein an inner surface, to be exposed to the mixed gaseous fluid, of the processing vessel, or a surface, to be exposed to the mixed gaseous fluid, of the component member is coated with a $SiO_2$ film;

wherein said apparatus fails to include means for generating a plasma in the processing vessel, and wherein the $SiO_2$ film is comprised of a plurality of $SiO_2$ layers.

18. The substrate processing apparatus according to claim 17 wherein the $SiO_2$ film has a thickness in a range of 0.5 to 1.5 μm, and wherein the plurality of $SiO_2$ layers are formed of a plurality of individually baked on layers of Si-containing raw material.

* * * * *